(12) United States Patent
Bouche et al.

(10) Patent No.: US 9,362,165 B1
(45) Date of Patent: Jun. 7, 2016

(54) 2D SELF-ALIGNED VIA FIRST PROCESS FLOW

(71) Applicant: GLOBALFOUNDRIES Inc., Grand Cayman (KY)

(72) Inventors: Guillaume Bouche, Albany, NY (US); Andy Wei, Queensbury, NY (US); Sudharshanan Raghunathan, Mechanicsville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/707,443

(22) Filed: May 8, 2015

(51) Int. Cl.
| | | |
|---|---|---|
| *H01L 23/48* | (2006.01) | |
| *H01L 21/02* | (2006.01) | |
| *H01L 21/768* | (2006.01) | |
| *H01L 23/522* | (2006.01) | |
| *H01L 23/532* | (2006.01) | |

(52) U.S. Cl.
CPC ...... *H01L 21/76843* (2013.01); *H01L 21/7684* (2013.01); *H01L 21/76802* (2013.01); *H01L 23/5226* (2013.01); *H01L 23/5329* (2013.01)

(58) Field of Classification Search
CPC ............. H01L 21/7684; H01L 21/76802; H01L 21/76843; H01L 23/5226; H01L 23/5329
See application file for complete search history.

(56) References Cited

U.S. PATENT DOCUMENTS

| | | | | |
|---|---|---|---|---|
| 4,182,636 | A * | 1/1980 | Dennard | H01L 21/033 257/510 |
| 6,020,255 | A * | 2/2000 | Tsai | H01L 21/76807 257/E21.579 |
| 6,083,824 | A * | 7/2000 | Tsai | H01L 21/31144 257/E21.257 |
| 8,394,718 | B1 * | 3/2013 | Gambino | H01L 21/3081 257/E21.578 |
| 2002/0155693 | A1 * | 10/2002 | Hong | H01L 21/76897 438/618 |
| 2013/0295769 | A1 * | 11/2013 | Lin | H01L 21/0274 438/692 |
| 2014/0015135 | A1 * | 1/2014 | Rieger | H01L 21/76877 257/741 |
| 2015/0236106 | A1 | 8/2015 | Zaleski et al. | |

* cited by examiner

*Primary Examiner* — Nicholas Tobergte
(74) *Attorney, Agent, or Firm* — Ditthavong & Steiner, P.C.

(57) ABSTRACT

A method of forming 2D self-aligned vias before forming a subsequent metal layer and reducing capacitance of the resulting device and the resulting device are provided. Embodiments include forming dummy metal lines in a SiOC layer and extending in a first direction; replacing the dummy metal lines with metal lines, each metal line having a nitride cap; forming a softmask stack over the nitride cap and the SiOC layer; patterning a plurality of vias through the softmask stack down to the metal lines, the plurality of vias self-aligned along a second direction; removing the softmask stack; forming second dummy metal lines over the metal lines and extending in the second direction; forming a second SiOC layer between the dummy second metal lines on the SiOC layer; and replacing the dummy second metal lines with second metal lines, the second metal lines electrically connected to the metal lines through a via.

15 Claims, 8 Drawing Sheets

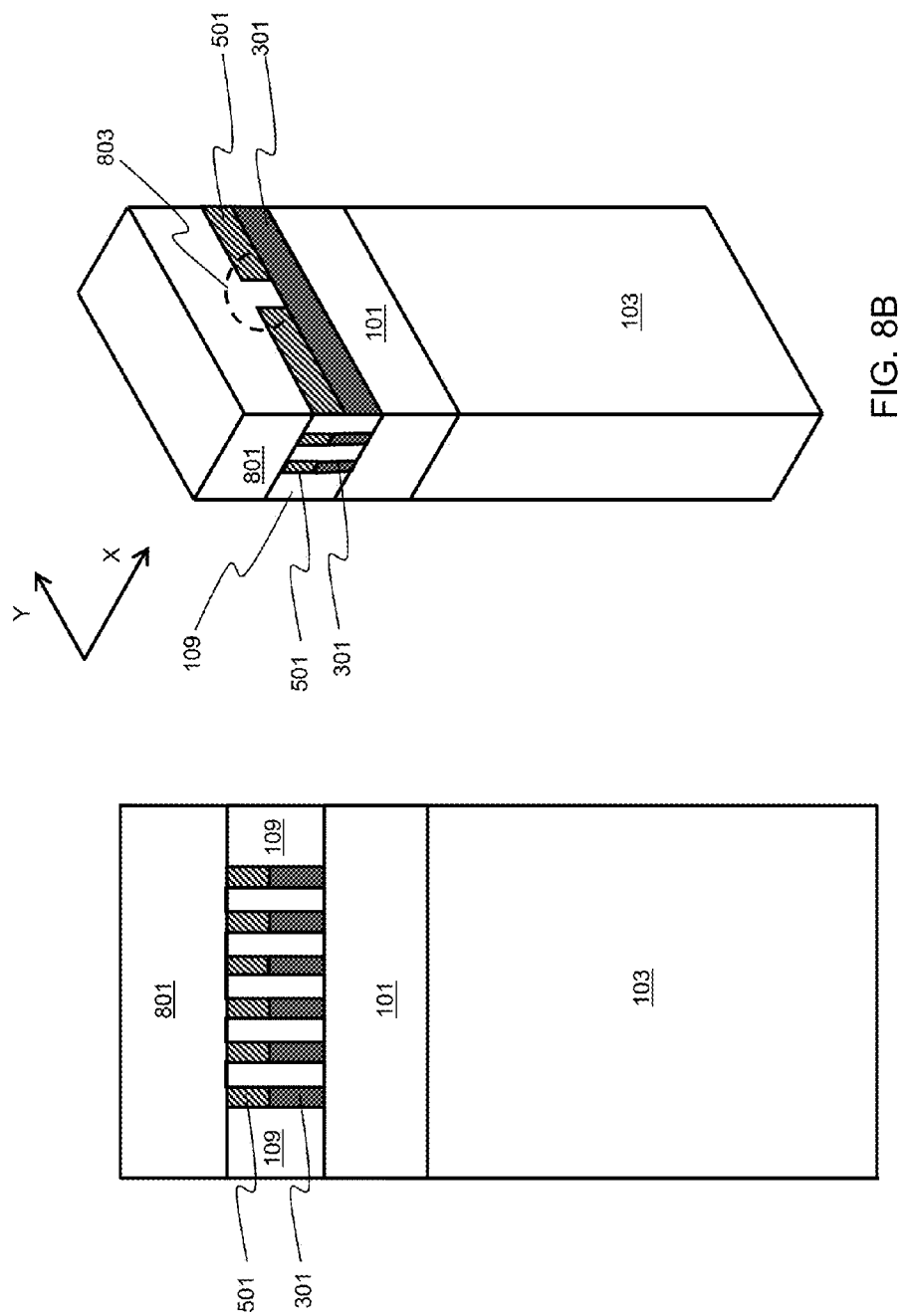

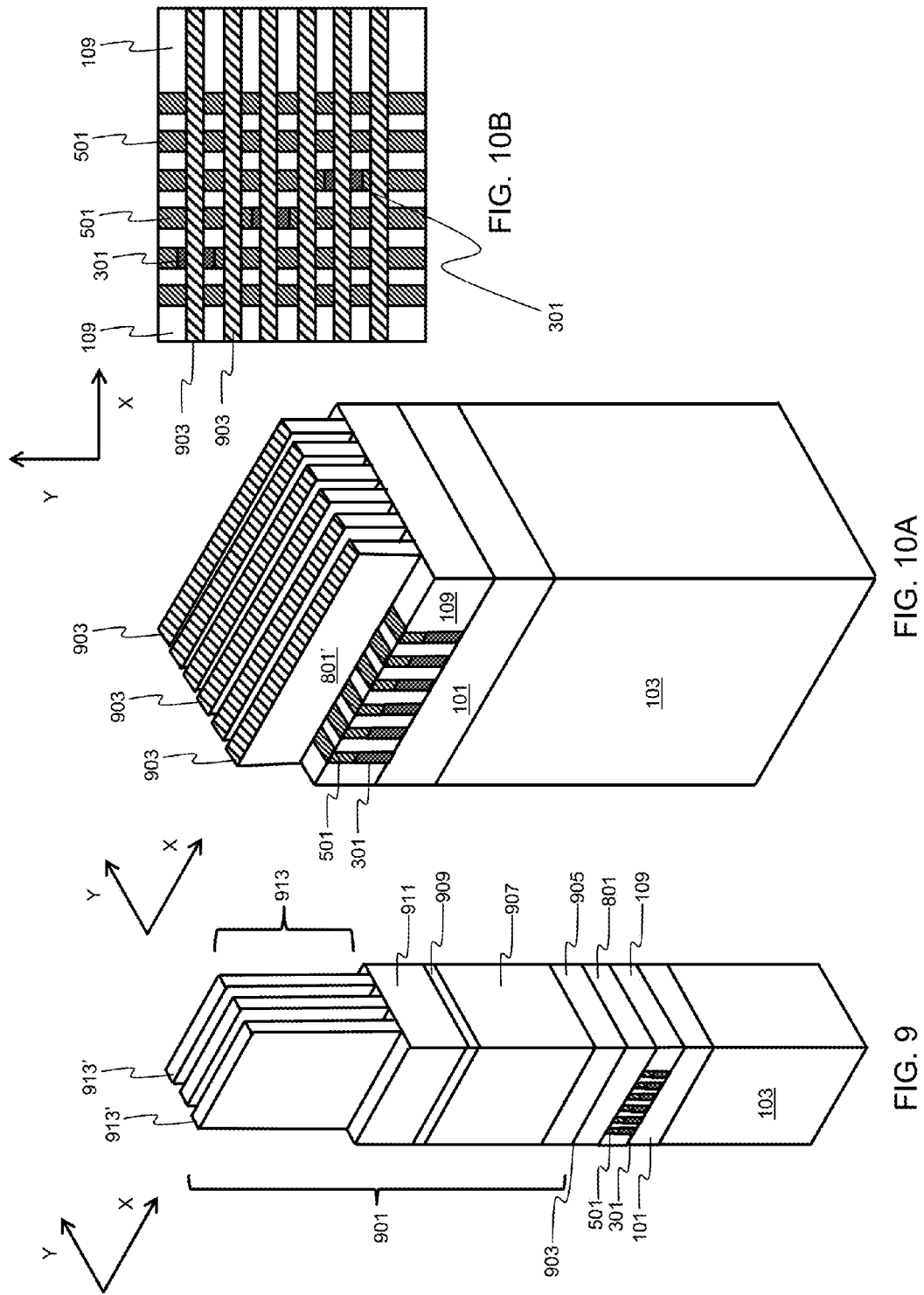

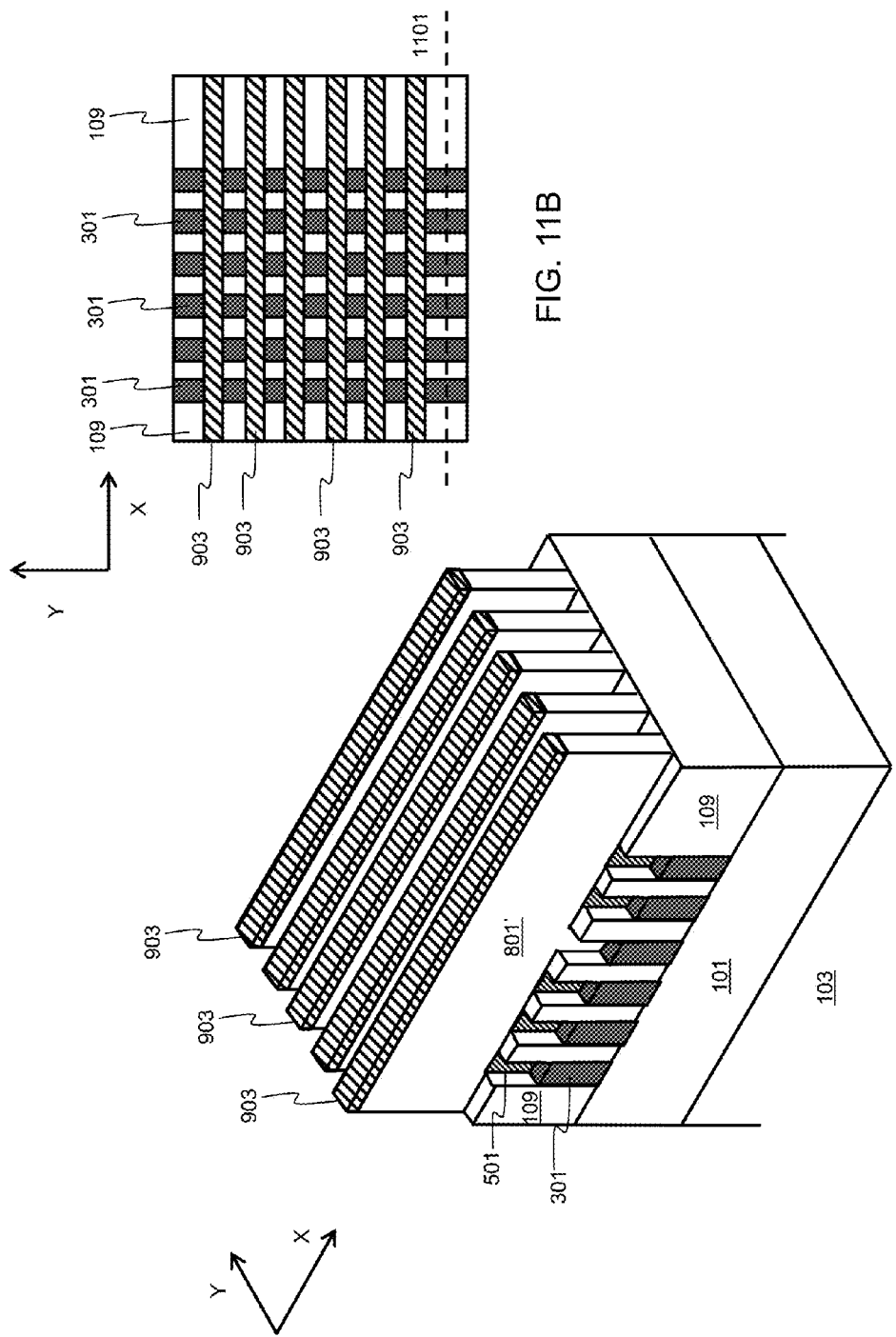

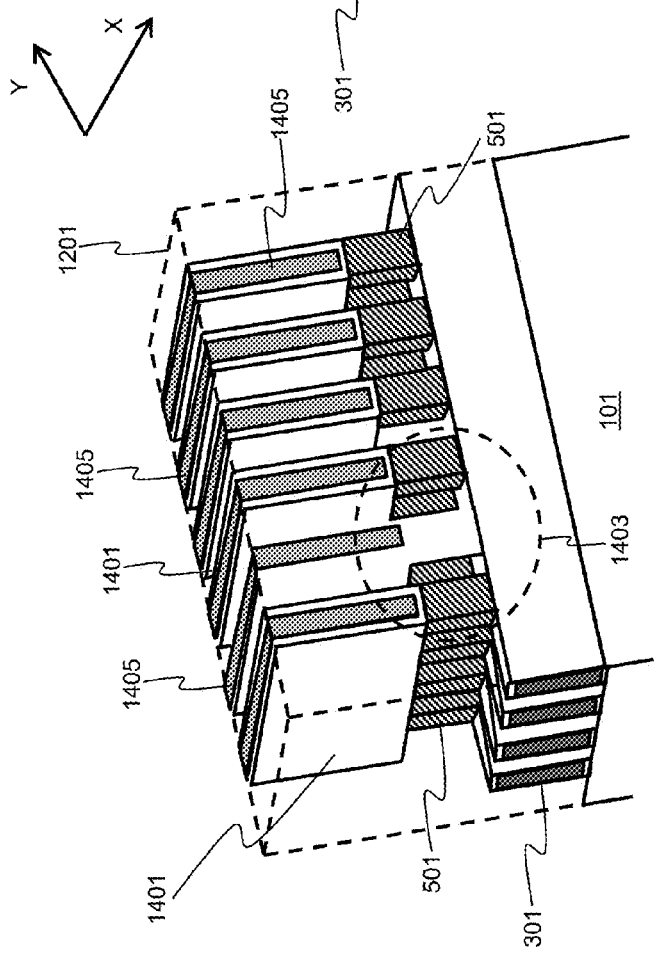
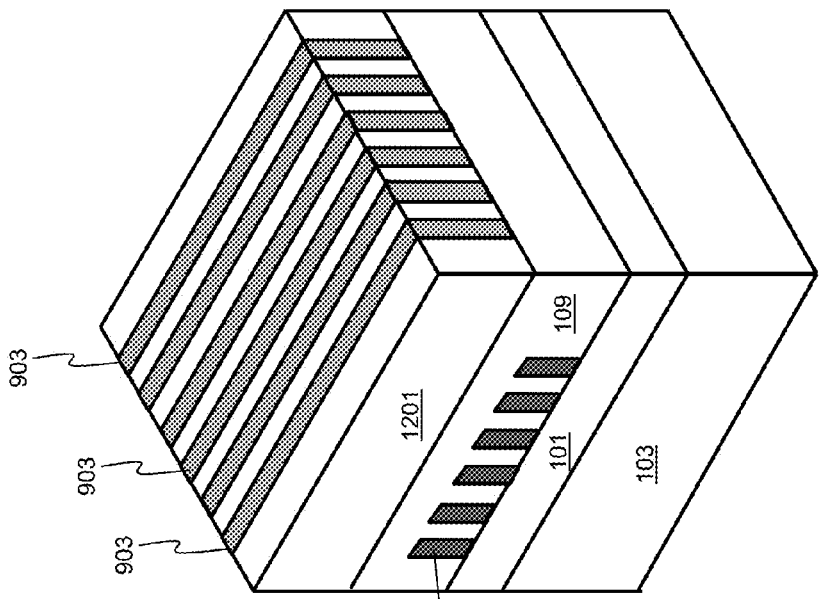
FIG. 14A
FIG. 14B

2D SELF-ALIGNED VIA FIRST PROCESS FLOW

TECHNICAL FIELD

The present disclosure relates to the manufacture of semiconductor devices with vias or interconnects. The present disclosure is particularly applicable to the 10 nanometer (nm) technology node and beyond.

BACKGROUND

To provide electrical conductivity between layers in a semiconductor device, a via or interconnect may be formed through an interlayer dielectric (ILD). The via is generally formed using a photolithographic mask. The via is then lined with a barrier and filled with an electrically conductive material such as copper (Cu) to provide electrical conductivity between two or more metal layers, e.g., Mx and Mx+1. Each of the metal layers is also generally formed using a respective photolithographic mask.

A known approach for forming two-dimensional (2D) self-aligned vias involves forming the Mx+1 layer before forming the vias and then patterning the vias at the bottom of trenches created by removing the Mx+1 dummy lines to form the Mx+1 layer. In this approach, a nitride cap remains over the entire Mx layer, which increases the capacitance of the semiconductor device and, therefore, reduces performance. Further, a separate photolithography mask is required for forming each metal layer and the vias, which increases processing costs.

A need therefore exists for methodology enabling a less expensive 2D self-aligned via formation process and a reduction of device capacitance, and the resulting device.

SUMMARY

An aspect of the present disclosure is a method of lithographically forming 2D self-aligned vias before forming a subsequent metal layer while reducing overall capacitance of the resulting device.

Another aspect of the present disclosure is a mechanically robust device including 2D self-aligned vias and minimal Mx line nitride.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming parallel dummy first metal lines in a first silicon oxycarbide (SiOC) layer and extending in a first direction; replacing the dummy first metal lines with first metal lines, each first metal line having a nitride cap; forming a first softmask stack over the nitride cap and the first SiOC layer; patterning a plurality of vias through the softmask stack down to the first metal lines, the plurality of vias self-aligned along a second direction; removing the first softmask stack; forming parallel dummy second metal lines over the first metal lines and extending in the second direction; forming a second SiOC layer between the dummy second metal lines on the first SiOC layer; and replacing the dummy second metal lines with second metal lines, the second metal lines electrically connected to the first metal lines through at least one of the vias.

Aspects of the present disclosure include forming the dummy first lines by: forming an oxide layer over a silicon substrate; forming the first SiOC layer over the oxide layer; forming parallel trenches in the first SiOC layer extending in the first direction; filling the trenches partially with amorphous silicon (a-Si); forming a nitride layer over the a-Si and the first SiOC layer; and planarizing the nitride layer down to the first SiOC layer. Other aspects include replacing the dummy first metal lines with the first metal lines by: removing the a-Si and nitride layer from the trenches down to the oxide layer; forming a barrier layer over the trenches and first SiOC layer; forming a first metal layer over the barrier layer; planarizing the first metal layer; recessing the first metal layer; forming the nitride cap over the recessed first metal layer and the first SiOC layer; and planarizing the nitride cap down to the first SiOC layer. Further aspects include forming the softmask stack by: forming a spin-on-hardmask (SOH) layer over the nitride cap and first SiOC layer; forming a silicon oxynitrdie (SiON) layer over the SOH layer; forming a buried anti-reflective coating (BARC) layer over the SiON layer; and forming a photoresist layer over the BARC layer. Additional aspects include patterning the plurality of vias by: forming a plurality of holes by lithography in the photoresist down to the BARC; transferring the plurality of holes down to the nitride cap; and etching the plurality of holes selective to the first metal lines and the first SiOC layer.

Another aspect includes forming the dummy second metal lines by: forming a dummy a-Si layer over the nitride cap and first SiOC layer and in the plurality of vias; forming a second softmask stack over the dummy a-Si layer; and patterning the second softmask stack and dummy a-Si layer down to the nitride cap and first SiOC layer. Other aspects include forming the second softmask stack by: forming a nitride layer over the dummy a-Si layer, the nitride layer having a thickness greater than a thickness of the nitride cap; forming a second dummy a-Si layer over the nitride layer; forming a SOH layer over the other a-Si layer; forming a SiON layer over the SOH layer; forming a BARC layer over the SiON layer; and forming a photoresist layer over the BARC layer. Further aspects include patterning the second softmask stack and dummy a-Si layer by: patterning the photoresist layer into parallel lines, the parallel lines patterned along the second direction; and etching between the parallel lines down to the nitride cap and the first SiOC layer. Additional aspects include removing the a-Si layer from the plurality of vias and the nitride cap between the parallel lines down to the first metal lines; and removing the second dummy a-Si layer and the SOH, SiON, BARC, and photoresist layers. Another aspect includes removing the nitride cap between the parallel lines concurrently with removing the a-Si layer from the plural vias. Other aspects include replacing the dummy second metal lines with second metal lines by: forming the second SiOC layer over and between the dummy second metal lines; planarizing the second SiOC layer down to the nitride layer; etching the dummy second metal lines down to the nitride cap and the first SiOC layer, forming parallel trenches; forming a barrier layer over the second SiOC layer and the trenches and in the plurality of vias; forming a second metal layer over the barrier layer; and planarizing the second metal layer down the second SiOC layer.

Another aspect of the present disclosure is a device including: a silicon substrate; an oxide layer formed over the substrate; a first SiOC layer formed over the oxide layer; parallel first metal lines recessed in the first SiOC layer and extending in a first direction; an array of nitride caps and vias over the first metal lines, formed in the recessed first SiOC; parallel second metal lines extending in a second direction perpendicular to the first direction, the second metal lines being formed over the nitride caps, the vias, and the first SiOC layer; and a second SiOC between the second metal lines, down to the first SiOC and the first metal lines.

Aspects of the device include the nitride caps being formed to a thickness of 15 nm to 40 nm. Other aspects include the plurality of vias being resized by the formation of the second metal lines. Further aspects include the plurality of vias being self-aligned in both the first and the second directions.

A further aspect of the present disclosure is a method including: forming parallel first metal lines in a first SiOC layer and extending in a first direction, the first metal lines having a nitride cap; forming a first softmask stack over the nitride cap and first SiOC layer; forming a plurality of vias through the first softmask stack down to the first metal lines, the plurality of vias self-aligned along a second direction; removing the first softmask; and forming second metal lines in a second SiOC layer and extending in the second direction, the second metal lines electrically connected to the first metal lines through at least one of the plurality of vias.

Aspects of the present disclosure include forming the first metal lines by: forming an oxide layer over a silicon substrate; forming the first SiOC layer over the oxide layer; forming parallel trenches in the first SiOC layer in the first direction; filling the trenches partially with a-Si; forming a nitride layer over the a-Si and the first SiOC layer; planarizing the nitride layer down to the first SiOC layer; removing the a-Si and nitride layer from the trenches down to the oxide layer; forming a barrier layer over the trenches and first SiOC layer; forming a first metal layer over the barrier layer; planarizing the first metal layer; recessing the first metal layer; forming the nitride cap over the recessed first metal layer and the first SiOC layer; and planarizing the nitride cap down to the first SiOC layer. Other aspects include forming the first softmask and the plurality of vias by: forming a SOH layer over the nitride cap and first SiOC layer; forming a SiON layer over the SOH layer; forming a BARC layer over the SiON layer; forming a photoresist layer over the BARC layer; forming a plurality of holes by lithography in the photoresist layer down to the BARC; transferring the plurality of holes down to the nitride cap; and etching the plurality of holes selective to the first metal lines and first SiOC layer. Further aspects include forming dummy metal lines prior to forming the second metal lines by: forming a first a-Si layer over the nitride cap and first SiOC layer and in the plurality of vias; forming a nitride layer over the first a-Si layer, the nitride layer having a thickness greater than a thickness of the nitride cap; forming a second a-Si layer over the nitride layer; forming a SOH layer over the second a-Si layer; forming a SiON layer over the SOH layer; forming a BARC layer over the SiON layer; forming a photoresist layer over the BARC layer; patterning the photoresist layer into parallel lines, the parallel lines patterned along the second direction; etching between the parallel lines down to the nitride cap and the first SiOC layer; removing the a-Si layer from the plurality of vias from opposite sides of each parallel line; removing the second a-Si layer and the SOH, SiON, BARC, and photoresist layers; and removing the nitride cap from opposite sides of each dummy metal line. Additional aspects include forming the second metal lines by: forming the second SiOC layer over the dummy lines; planarizing the second SiOC layer down to the nitride layer; etching the dummy lines down to the nitride cap and the first SiOC layer, forming parallel trenches; forming a barrier layer over the second SiOC layer and the trenches and in the plurality of vias; forming a second metal layer over the barrier layer; and planarizing the second metal layer down the second SiOC layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 14B schematically illustrate a process flow for forming 2D self-aligned vias before forming a subsequent metal layer, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of a need for separate photolithographic masks for forming metal layers and vias, difficult via patterning due to aspect ratio, and high capacitance of nitride attendant upon forming vias through metal line trenches in a semiconductor device.

Methodology in accordance with embodiments of the present disclosure includes forming parallel dummy first metal lines in a first SiOC layer and extending in a first direction. The dummy first metal lines are replaced with first metal lines, each first metal line having a nitride cap. A first softmask stack is formed over the nitride cap and the first SiOC layer, and a plurality of vias are patterned through the softmask stack down to the first metal lines, the plurality of vias self-aligned along a second direction. The first softmask stack is removed and parallel dummy second metal lines are formed over the first metal lines and extended in the second direction. A second SiOC layer is formed between the dummy second metal lines on the first SiOC layer, and the dummy second metal lines are replaced with second metal lines. The second metal lines are electrically connected to the first metal lines through at least one of the vias.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
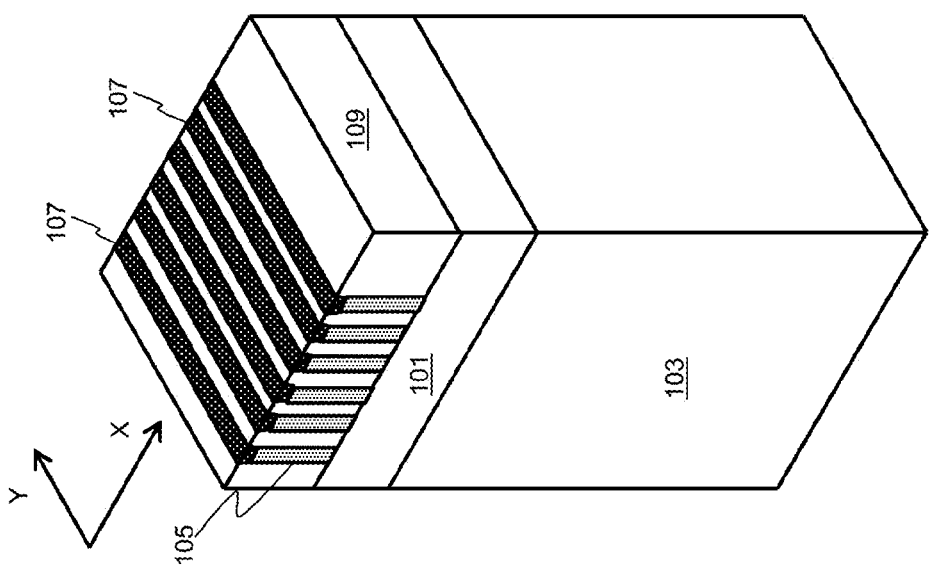

Adverting to FIG. 1 (FIG. 1 is an orthographic view of a Mx stack), an oxide layer 101 is formed on a silicon substrate 103. Dummy metal lines 105 are formed, e.g., of a-Si, on top of the oxide layer 101 along with a nitride cap layer 107. Next, a SiOC layer 109 is formed over the dummy metal lines 105 and the nitride cap layer 107 and then planarized, e.g., by CMP, down to the nitride cap layer 107. The dummy lines 105 may be formed, for example, by self-aligned double patterning (SADP) or self-aligned quadruple patterning (SAQP) to achieve a small pitch, e.g., a pitch less than 64 nm, such as 10 nm to 35 nm. The dummy metal lines 105 may be formed, for example, with a width of 10 nm to 35 nm and a height of 30 nm to 120 nm (including the nitride cap layer 107).

Figure 3:
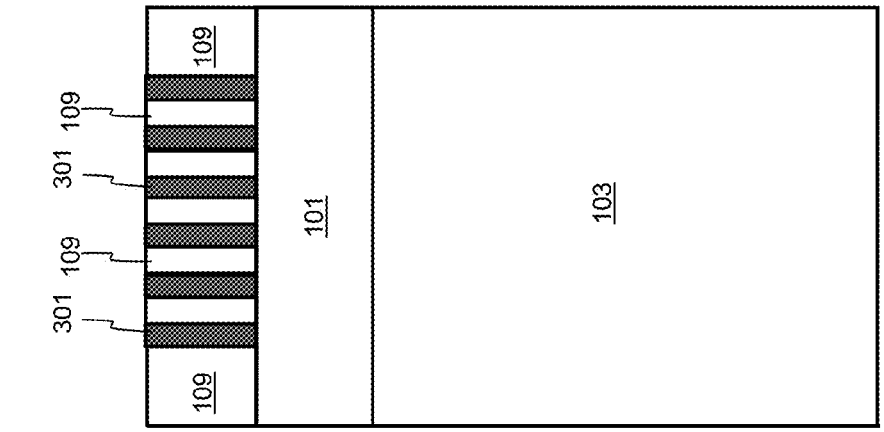
Figure 2:
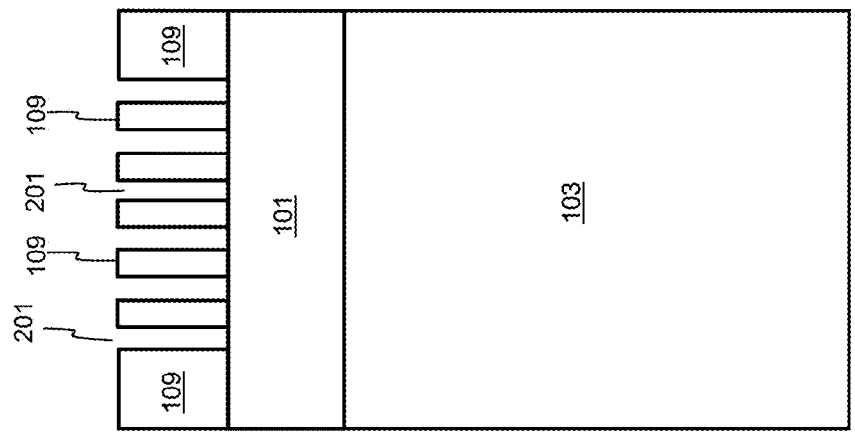
Figure 5:
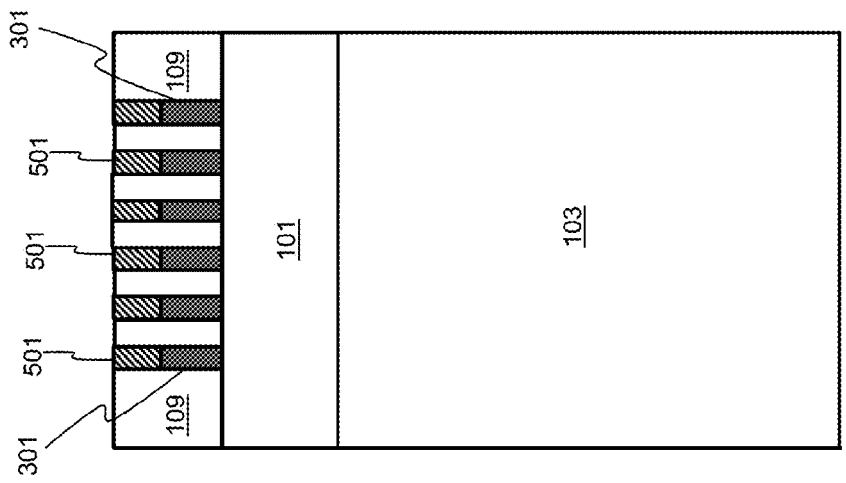
Figure 4:
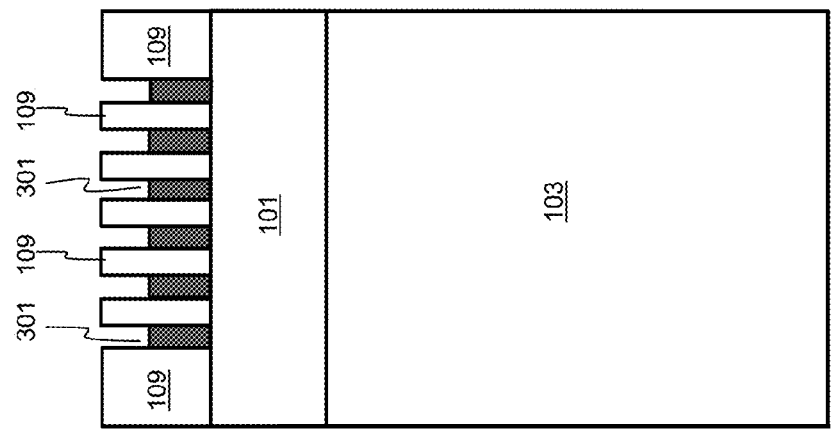

Next, the dummy metal lines 105 are removed down to the oxide layer 101, e.g., by wet bromide reactive ion etching (RIE) or aqueous tetramethylammonium hydroxide (TMAH) wet etching, forming parallel trenches 201, as depicted in FIG. 2 (FIGS. 2 and 3 depict a cross-sectional view of the Mx stack along the x direction). A barrier layer (not shown for illustrative convenience) is then formed, e.g., of tantalum nitride (TaN), titanium nitride (TiN), or ruthenium (Ru), over the parallel trenches 201 and the SiOC layer 109. Thereafter, metal lines 301 are formed, for example, of tungsten (W), cobalt (Co), or Cu, e.g., Co, over the barrier layer and then planarized, e.g., by CMP, down to the SiOC layer 109, as depicted in FIG. 3. Adverting to FIG. 4 (FIGS. 4 and 5 depict a cross-sectional view of the Mx stack along the x direction), the metal lines 301 are recessed, e.g., 15 nm to 40 nm. Next, a nitride cap layer 501 is deposited over the recessed metal lines 301 and the SiOC layer 109 and then planarized, e.g., by CMP, down to the SiOC layer 109, as depicted in FIG. 5.

Figure 7:
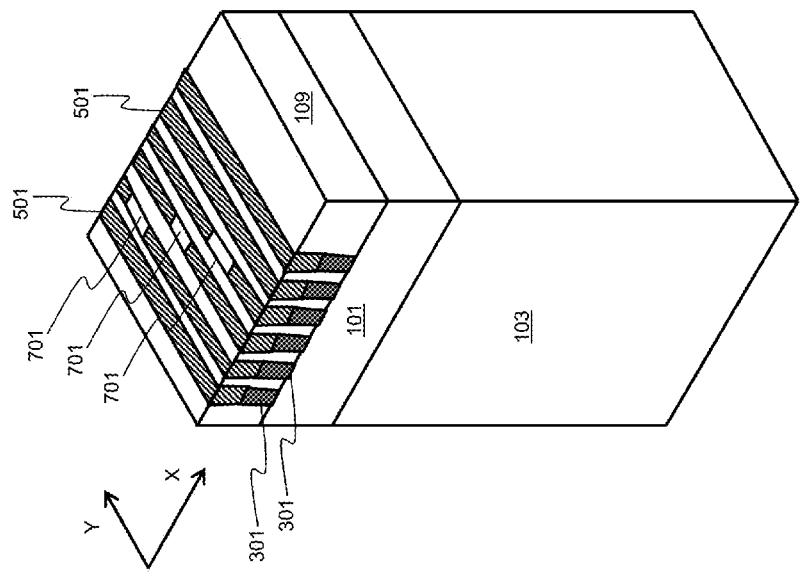
Figure 6:
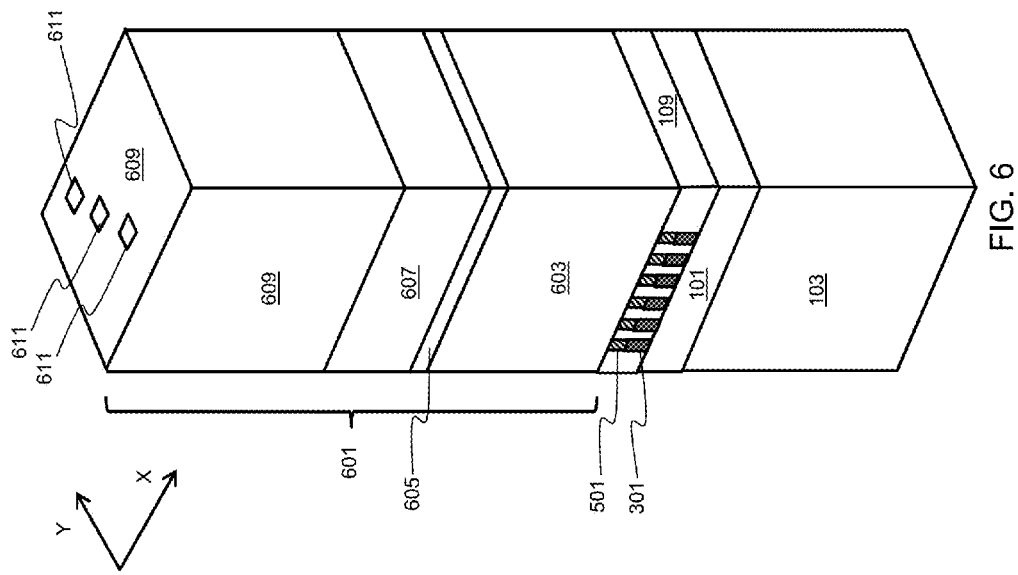

Adverting to FIG. 6 (FIG. 6 is an orthographic view of a softmask stack formed on top of the Mx stack), a softmask stack 601 is formed over the nitride cap layer 501 and the SiOC layer 109. The softmask stack 601 may be formed, for example, of a SOH layer 603, a SiON layer 605, a BARC layer 607, and a photoresist layer 609. Next, holes 611 are formed by lithography in the photoresist layer 609 down to the BARC layer 607. The holes 611 are then transferred down from the BARC layer 607 to the nitride cap layer 501 and the softmask stack 601 is removed. Thereafter, the holes 611 are etched, e.g., by nitride RIE, selective to the metal lines 301 and the SiOC 109 forming vias 701, as depicted in FIG. 7. The resulting vias 701 are one-dimensional (1D) self-aligned along the x direction because although the holes 611 are larger in the x direction than the vias 701, the resulting vias 701 are resized by the selective etching, which resolves issues with overlay.

Once the vias 701 are formed, dummy metal lines may be formed for a subsequent metal layer, e.g., Mx+1. Adverting to FIGS. 8A and 8B (FIG. 8A depicts a cross-sectional view of the Mx stack and the start of the Mx+1 stack along the x direction and FIG. 8B depicts a cut of FIG. 8A along the y direction), a dummy a-Si layer 801 is formed over the nitride cap 501 and the SiOC layer 109 and in the vias 701 (as shown by the dashed circle 803). Next, a softmask stack 901 is formed over the dummy a-Si layer 801, as depicted in FIG. 9 (FIG. 9 is an orthographic view of a softmask stack formed on top of the Mx stack). The softmask stack 901 may be formed, for example, of a nitride cap layer 903, a-Si layer 905, a SOH layer 907, a SiON layer 909, a BARC layer 911, and a photoresist layer 913. Thereafter, the photoresist layer 913 is patterned into parallel lines 913' in the y direction. While the x and y directions are depicted at a right angle, the x and y directions only need to be different from each other to enable 2D patterning.

FIG. 10A depicts an orthographic view of the Mx stack and Mx+1 dummy lines and FIG. 10B is an overhead view of FIG. 10A. Adverting to FIGS. 10A and 10B, the softmask stack 901 is patterned, and the dummy a-Si layer 801 is etched by an anisotropic a-Si etch between the parallel lines 913' down to the nitride cap 501 and the SiOC layer 109. Dummy metal lines 801', which include the nitride cap layer 903, are formed. The anisotropic a-Si etch is performed with enough overetch to remove the dummy a-Si 801 in the vias 701. Consequently, the metal lines 301 are visible through the vias 701, as depicted in FIG. 10B. In addition, as a result of the formation of the dummy metal lines 801', the vias 701 are now also 1D self-aligned along the y direction.

The nitride cap 501 is also removed between the parallel lines 913' by a nitride anisotropic etch, as depicted in FIGS. 11A and 11B (FIG. 11A is an orthographic view of the Mx stack and Mx+1 dummy lines corresponding to the dashed line 1101, and FIG. 11B is an overhead view of FIG. 11A). The nitride cap layer 903 needs to be formed with a thickness greater than the thickness of the nitride cap layer 501 so that at least some portion of the nitride cap layer 903 will remain after the nitride anisotropic etching. After the nitride anisotropic etch, the nitride cap 501 only remains under the dummy lines 801'. The intent is to strip as much of the nitride cap 501 as possible because nitride has a high capacitance value. The areas where the nitride cap 501 was removed will subsequently be filled with a SiOC layer, reducing the overall capacitance of the resulting device. In an alternative embodiment, the nitride cap 501 may be removed between the parallel lines 913' at the same time as the anisotropic a-Si etch of FIGS. 10A and 10B.

Figure 13:
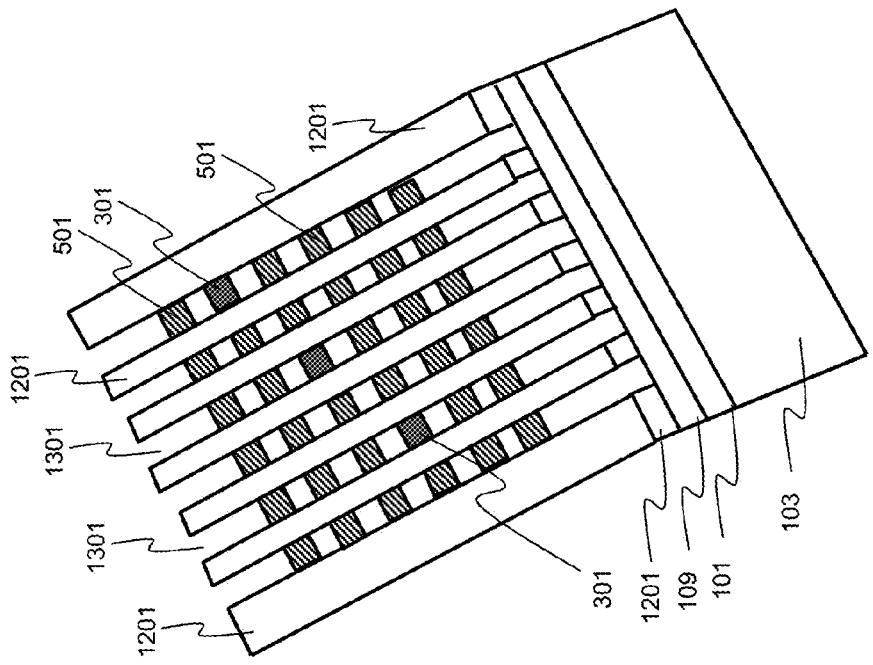
Figure 12:
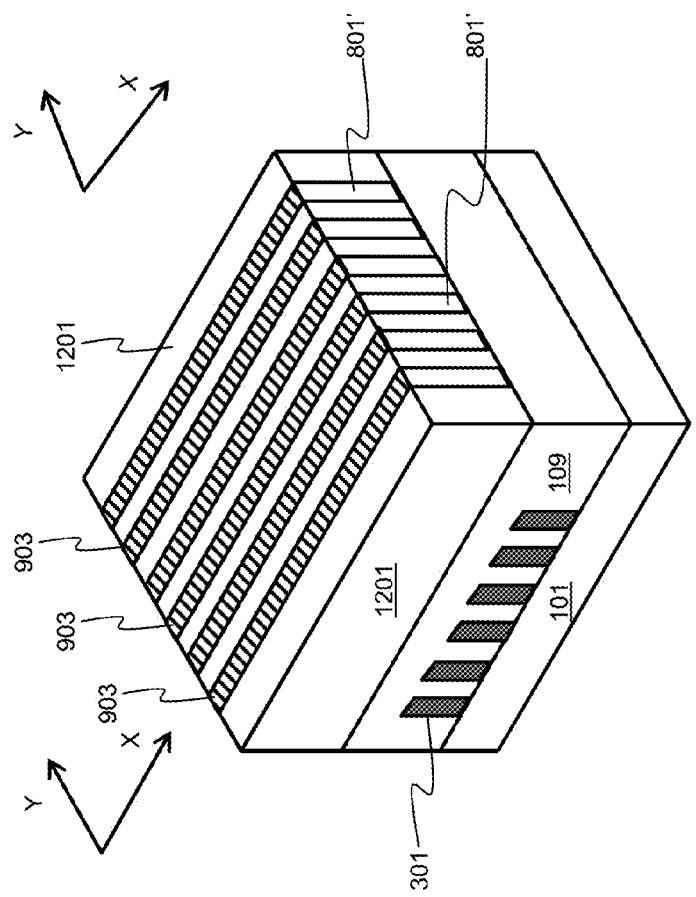

Adverting to FIG. 12 (FIG. 12 is an orthographic view of the Mx layer and the Mx+1 dummy lines), a SiOC layer 1201 is formed over and between the dummy metal lines 801' and then planarized, e.g., by CMP, down to the nitride cap layer 903. The dummy metal lines 801' and the nitride cap layer 903 are then removed down to the nitride layer 501 and the SiOC layer 109, e.g., by etching, forming parallel trenches 1301 as depicted in FIG. 13 (FIG. 13 is an overhead orthographic view of the Mx+1 stack). With the dummy metal lines 801' removed, the metal lines 301 can be seen through the vias 701 as well as the remaining nitride cap layer 501, which was previously masked by the dummy metal lines 801'.

FIGS. 14A and 14B are orthographic views of the resulting device with the SiOC layers 109 and 1201 of FIG. 14A shown transparent. Adverting to FIGS. 14A and 14B, a barrier layer 1401 is formed over the SiOC layer 1201 and the trenches 1301 and in the vias 701 so that it can connect with the barrier layer of the metal lines 301, as shown by dashed circle 1403. Next, metal lines 1405 are formed, e.g., of Cu, over the barrier layer 1401 and then planarized, e.g., by CMP, down to the SiOC layer 1201. Both metal lines may be formed of the same conductive material, e.g., Cu, or they may be formed of different materials, e.g., Co for Mx and Cu for Mx+1. Consequently, a via 701 is formed at each intersection of the metal lines 301 and 1405, forming a regular array. Most of the vias 701 are filled with the nitride cap layer 501, but some as shown by the dashed circle 1403 electrically connect the metal lines 301 and the metal lines 1405 through the respective barrier layers. The result is a robust mechanical structure that will not collapse with subsequent bumping processes.

The embodiments of the present disclosure can achieve several technical effects including forming vias lithographically before forming a subsequent metal layer so that the Via and Mx cut masks may be combined while keeping it a 2D self-aligned process. In addition, 50% of the Mx line nitride cap is replaced with SiOC reducing the capacitance of the resulting device. This effect can potentially be achieved at no extra cost where the nitride removal is integrated with the Mx+1 dummy a-Si etch and the SiOC deposition is part of the standard dielectric deposition between Mx+1 dummy lines. Further, via patterning is no longer required at the bottom of the Mx+1 trench, which is potentially difficult because of aspect ratio. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming parallel dummy first metal lines in a first silicon oxycarbide (SiOC) layer and extending in a first direction;
    replacing the dummy first metal lines with first metal lines, each first metal line having a nitride cap;
    forming a first softmask stack over the nitride cap and the first SiOC layer;
    patterning a plurality of vias through the softmask stack down to the first metal lines, the plurality of vias self-aligned along a second direction;
    removing the first softmask stack;
    forming parallel dummy second metal lines over the first metal lines and extending in the second direction;
    forming a second SiOC layer between the dummy second metal lines on the first SiOC layer; and
    replacing the dummy second metal lines with second metal lines, the second metal lines electrically connected to the first metal lines through at least one of the vias.

2. The method according to claim 1, comprising forming the dummy first lines by:
    forming an oxide layer over a silicon substrate;
    forming the first SiOC layer over the oxide layer;
    forming parallel trenches in the first SiOC layer extending in the first direction;
    filling the trenches partially with amorphous silicon (a-Si);
    forming a nitride layer over the a-Si and the first SiOC layer; and
    planarizing the nitride layer down to the first SiOC layer.

3. The method according to claim 2, comprising replacing the dummy first metal lines with the first metal lines by:
    removing the a-Si and nitride layer from the trenches down to the oxide layer;
    forming a barrier layer over the trenches and first SiOC layer;
    forming a first metal layer over the barrier layer;
    planarizing the first metal layer;
    recessing the first metal layer;
    forming the nitride cap over the recessed first metal layer and the first SiOC layer; and
    planarizing the nitride cap down to the first SiOC layer.

4. The method according to claim 1, comprising forming the softmask stack by:
    forming a spin-on-hardmask (SOH) layer over the nitride cap and first SiOC layer;
    forming a silicon oxynitrdie (SiON) layer over the SOH layer;
    forming a buried anti-reflective coating (BARC) layer over the SiON layer; and
    forming a photoresist layer over the BARC layer.

5. The method according to claim 1, comprising patterning the plurality of vias by:
    forming a plurality of holes by lithography in the photoresist down to the BARC;
    transferring the plurality of holes down to the nitride cap; and
    etching the plurality of holes selective to the first metal lines and the first SiOC layer.

6. The method according to claim 1, comprising forming the dummy second metal lines by:
    forming a dummy a-Si layer over the nitride cap and first SiOC layer and in the plurality of vias;
    forming a second softmask stack over the dummy a-Si layer; and
    patterning the second softmask stack and dummy a-Si layer down to the nitride cap and first SiOC layer.

7. The method according to claim 6, comprising forming the second softmask stack by:
    forming a nitride layer over the dummy a-Si layer, the nitride layer having a thickness greater than a thickness of the nitride cap;
    forming a second dummy a-Si layer over the nitride layer;
    forming a SOH layer over the other a-Si layer;
    forming a SiON layer over the SOH layer;
    forming a BARC layer over the SiON layer; and
    forming a photoresist layer over the BARC layer.

8. The method according to claim 7, comprising patterning the second softmask stack and dummy a-Si layer by:
    patterning the photoresist layer into parallel lines, the parallel lines patterned along the second direction; and
    etching between the parallel lines down to the nitride cap and the first SiOC layer.

9. The method according to claim 8, further comprising:
    removing the a-Si layer from the plurality of vias and the nitride cap between the parallel lines down to the first metal lines; and
    removing the second dummy a-Si layer and the SOH, SiON, BARC, and photoresist layers.

10. The method according to claim 9, comprising removing the nitride cap between the parallel lines concurrently with removing the a-Si layer from the plural vias.

11. The method according to claim 7, comprising replacing the dummy second metal lines with second metal lines by:
    forming the second SiOC layer over and between the dummy second metal lines;
    planarizing the second SiOC layer down to the nitride layer;
    etching the dummy second metal lines down to the nitride cap and the first SiOC layer, forming parallel trenches;
    forming a barrier layer over the second SiOC layer and the trenches and in the plurality of vias;
    forming a second metal layer over the barrier layer; and
    planarizing the second metal layer down the second SiOC layer.

12. A method comprising:
forming parallel first metal lines in a first silicon oxycarbide (SiOC) layer and extending in a first direction, the first metal lines having a nitride cap;
forming a spin-on-hardmask (SOH) layer over the nitride cap and first SiOC layer;
forming a silicon oxynitride (SiON) layer over the SOH layer;
forming a buried anti-reflective coating (BARC) layer over the SiON layer;
forming a photoresist layer over the BARC layer;
forming a plurality of vias by lithography in the photoresist layer down to the BARC;
transferring the plurality of vias down to the nitride cap;
etching the plurality of vias selective to the first metal lines and first SiOC layer;
removing the first softmask; and
forming second metal lines in a second SiOC layer and extending in a second direction, the second metal lines electrically connected to the first metal lines through at least one of the plurality of vias.

13. The method according to claim 12, comprising forming the first metal lines by:
forming an oxide layer over a silicon substrate;
forming the first SiOC layer over the oxide layer;
forming parallel trenches in the first SiOC layer in the first direction;
filling the trenches partially with amorphous silicon (a-Si);
forming a nitride layer over the a-Si and the first SiOC layer;
planarizing the nitride layer down to the first SiOC layer;
removing the a-Si and nitride layer from the trenches down to the oxide layer;
forming a barrier layer over the trenches and first SiOC layer;
forming a first metal layer over the barrier layer;
planarizing the first metal layer;
recessing the first metal layer;
forming the nitride cap over the recessed first metal layer and the first SiOC layer; and
planarizing the nitride cap down to the first SiOC layer.

14. The method according to claim 12, comprising forming dummy metal lines prior to forming the second metal lines by:
forming a first a-Si layer over the nitride cap and first SiOC layer and in the plurality of vias;
forming a nitride layer over the first a-Si layer, the nitride layer having a thickness greater than a thickness of the nitride cap;
forming a second a-Si layer over the nitride layer;
forming a SOH layer over the second a-Si layer;
forming a SiON layer over the SOH layer;
forming a BARC layer over the SiON layer;
forming a photoresist layer over the BARC layer;
patterning the photoresist layer into parallel lines, the parallel lines patterned along the second direction;
etching between the parallel lines down to the nitride cap and the first SiOC layer;
removing the a-Si layer from the plurality of vias from opposite sides of each parallel line;
removing the second a-Si layer and the SOH, SiON, BARC, and photoresist layers; and
removing the nitride cap from opposite sides of each dummy metal line.

15. The method according to claim 14, comprising forming the second metal lines by:
forming the second SiOC layer over the dummy lines;
planarizing the second SiOC layer down to the nitride layer;
etching the dummy lines down to the nitride cap and the first SiOC layer, forming parallel trenches;
forming a barrier layer over the second SiOC layer and the trenches and in the plurality of vias;
forming a second metal layer over the barrier layer; and
planarizing the second metal layer down the second SiOC layer.

\* \* \* \* \*